United States Patent [19]
Hirata et al.

[11] Patent Number: 5,353,311
[45] Date of Patent: Oct. 4, 1994

[54] RADIO TRANSMITTER

[75] Inventors: Minoru Hirata; Osamu Yamamoto, both of Tokyo, Japan

[73] Assignee: NEC Corporation, Japan

[21] Appl. No.: 2,147

[22] Filed: Jan. 11, 1993

[30] Foreign Application Priority Data

Jan. 9, 1992 [JP] Japan .................................. 4-001904
Mar. 5, 1992 [JP] Japan .................................. 4-083405

[51] Int. Cl.$^5$ .................................................. H04K 1/00
[52] U.S. Cl. .......................................... 375/1; 375/97; 375/8; 375/5; 375/81; 328/155
[58] Field of Search ............... 375/1, 47, 8, 5, 81, 375/83, 86; 328/155; 329/304, 167, 50; 331/1 A, 12, 8; 325/41

[56] References Cited
U.S. PATENT DOCUMENTS

| | | | |
|---|---|---|---|
| 3,716,802 | 2/1973 | Muratani et al. | 331/8 |
| 3,969,678 | 7/1976 | Asahara et al. | 328/167 |
| 4,168,398 | 9/1979 | Matsuo et al. | 375/1 |
| 4,182,988 | 1/1980 | Murakami | 325/41 |
| 4,355,404 | 10/1982 | Uzunoglu | 375/86 |
| 4,466,108 | 8/1984 | Rhodes | 375/83 |
| 4,525,676 | 6/1985 | Atobe et al. | 329/50 |
| 4,538,120 | 8/1985 | Hawkes | 331/12 |
| 4,612,515 | 9/1986 | Ohkawa et al. | 331/1 A |
| 4,625,308 | 11/1986 | Kim et al. | 370/104 |
| 4,652,834 | 3/1987 | McAdam | 329/50 |
| 4,763,129 | 8/1988 | Perrotta | 342/356 |
| 4,825,437 | 4/1989 | Balech | 370/104 |
| 4,862,104 | 8/1989 | Muratani et al. | 331/1 A |
| 4,943,982 | 7/1990 | O'Neil et al. | 375/81 |
| 5,020,076 | 5/1991 | Cahill et al. | 375/5 |
| 5,065,408 | 11/1991 | Gillig | 375/8 |
| 5,077,531 | 12/1991 | Takeuchi et al. | 329/304 |
| 5,128,625 | 7/1992 | Yatsuzuka et al. | 328/155 |
| 5,150,377 | 9/1992 | Vannucci | 375/1 |
| 5,150,384 | 9/1992 | Cahill | 375/97 |

*Primary Examiner*—David C. Cain
*Attorney, Agent, or Firm*—Ostrolenk, Faber, Gerb & Soffen

[57] ABSTRACT

A radio transmitter suitable for a frequency hopping communication system which transmits a phase modulated signal with a minimum of spurious signals and phase noise. A direct digital frequency synthesizer (DDS) generates a frequency hopping signal lying in the VHF band. A first phase locked oscillator reduces the spurious components of the frequency hopping signal to produce a corresponding signal lying in the UHF band. This UHF band signal is used as a reference signal for a second phase locked oscillator which sends the phase modulated signal via a voltage controlled oscillator (VCO) built therein. The second phase locked oscillator includes a modulator for further modulating the phase of the phase modulated signal or a frequency divided version thereof by a modulating signal. The output of the modulator is used as a signal to be compared by a phase comparator or a source of signal to be compared. Since the second phase locked oscillator has a phase locked loop band sufficiently broader than the signal band of the modulating signal, it not only generates the phase modulated signal capable of sufficiently following the modulating signal, but also suppresses phase noise of the phase modulated signal ascribable to the VCO.

14 Claims, 6 Drawing Sheets

RADIO TRANSMITTER

BACKGROUND OF THE INVENTION

1. Field of the Invention

The present invention relates to a radio transmitter suitable for microwave and satellite communication systems and, more particularly, to a radio transmitter of the type effecting multicarrier TDMA (Time Divison Multiple Access) communication by frequency hopping.

2. Description of the Related Art

One of conventional radio transmitters of the type described has a direct digital frequency synthesizer (DDS)and a phase locked oscillator. The DDS generates a frequency hopping signal lying in the VHF band by hopping the frequency in a small frequency step and at high speed. The phase locked oscillator removes spurious signal components from the frequency hopping signal and produces a local oscillation signal whose frequency is an integral multiple (e.g. microwave band) of the frequency of the frequency hopping signal. A mixer combines the frequency of the local oscillation signal and the frequency of a modulated signal of intermediate frequency (IF) band to produce a transmit signal to be sent from the transmitter. The modulated signal is produced by modulating the phase of an IF carrier signal by, for example, a digital modulating signal.

The problem with such a conventional radio transmitter is that the transmitter is scaled up since it needs a band-pass filter for removing a needless wave signal ascribable to the mixer from the transmit signal. Moreover, when the hopping frequency range of the frequency hopping signal is broad, the frequency of the transmit signal and that of the needless wave signal are apt to approach each other. Then, the radio transmitter is likely to fail even to remove the needless wave signal.

It has been customary to provide the phase locked oscillator with a local oscillation signal generated by a voltage controlled oscillator having an oscillating element implemented by a transistor. However, when the loop band of the phase locked loop is reduced to remove the spurious signal components of the local oscillation signal, it is likely that the requirement on the phase noise level of the output local oscillation signal cannot be satisfied.

SUMMARY OF THE INVENTION

Objects of the Invention

It is, therefore, an object of the present invention to provide a radio transmitter capable of producing a phase modulated transmit signal without resorting to a mixer for mixing the frequencies of local oscillation signal and modulated signal.

It is another object of the present invention to provide a radio transmitter capable of transmitting the transmit signal in which both the spurious signals and the phase noise are reduced.

SUMMARY OF THE INVENTION

A radio transmitter of the present invention outputs a phase modulated transmit signal lying in a radio frequency band (e.g. microwave band). The transmitter has as a basic circuit thereof a first phase locked oscillator for outputting the transmit signal which is phase locked to an input reference signal. The first phase locked oscillator, like a conventional phase locked oscillator, has a voltage controlled oscillator (VCO) for outputting the transmit signal in response to a control signal, and a phase locked circuit for feeding the control signal to the VCO. However, the phase locked oscillator further includes in the phase locked circuit a phase modulator for modulating the phase of the transmit signal or that of a frequency modulated version of the transmit signal by a modulating signal. A phase modulated signal from the phase modulator is used as a signal to be compared by a phase comparator built in the phase locked circuit or a source of signal to be compared. A difference signal from the phase comparator is fed to a loop filter having a predetermined signal band. Then, the loop filter outputs the control signal. The transmitter provides a phase locked loop constituted by the VCO and phase locked circuit with a loop band (mainly determined by the band of the loop filter) which is sufficiently broader than the signal band of the modulating signal. Hence, despite the use of the VCO involving much phase noise, phase noise in an output signal ascribable to the VCO can be sufficiently reduced.

The radio transmitter of the present invention may further include a DDS for generating a frequency hopping signal, and a second phase locked oscillator for producing the reference signal phase locked to the frequency hopping signal. By sufficiently narrowing the phase locked loop band of the second phase locked oscillator, it is possible to remove spurious signal components apt to occur in the frequency hopping signal while insuring the rapid frequency hopping ability of the DDS.

BRIEF DESCRIPTION OF THE DRAWINGS

The above-mentioned and other objects, features and advantages of the present invention will become more apparent from the following detailed description when taken in conjunction with the accompanying drawings, wherein.

DETAILED DESCRIPTION OF THE PREFERRED EMBODIMENTS

Figure 1:
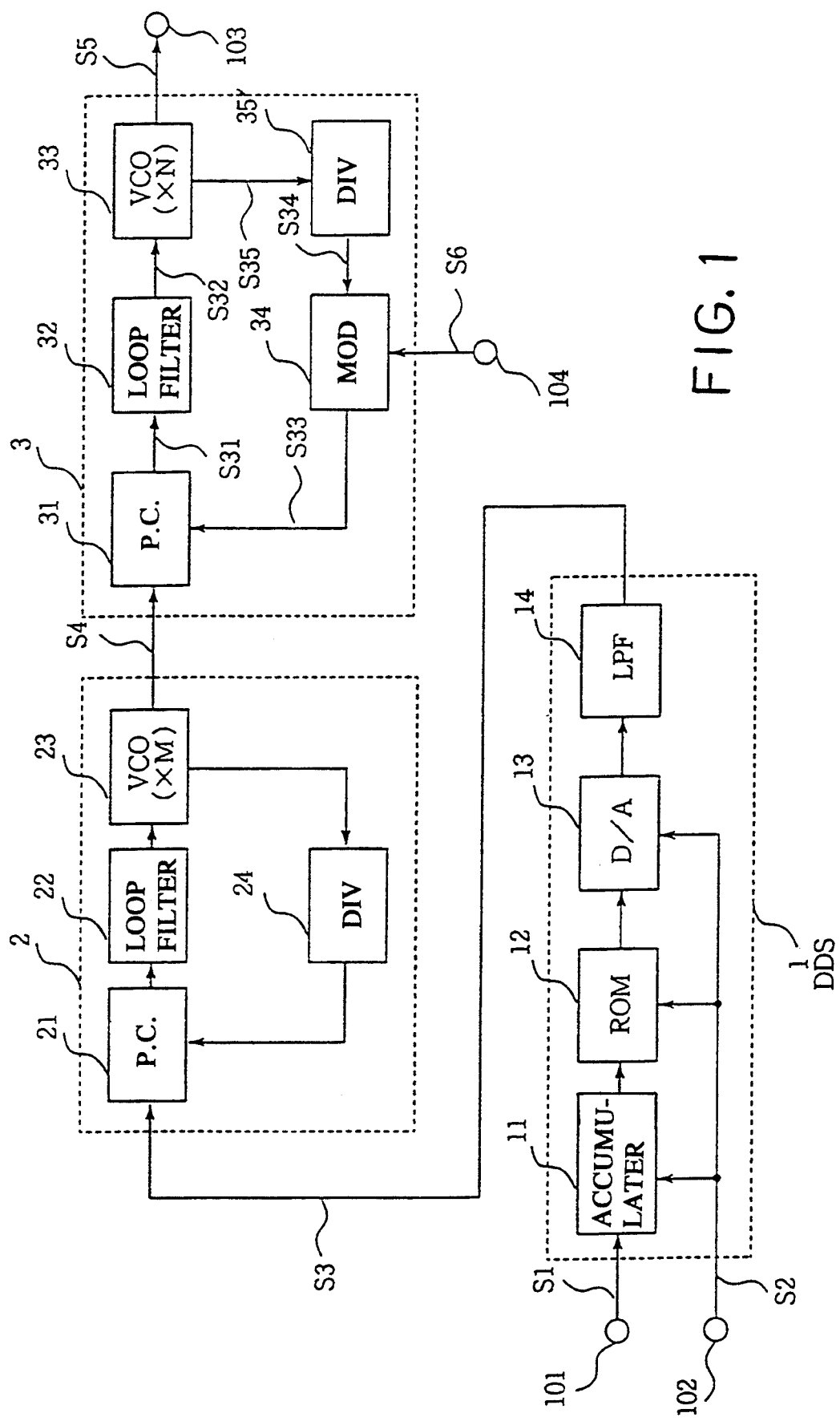
FIG. 1 is a block diagram schematically showing a radio transmitter embodying the present invention.

Referring to FIG. 1 of the drawings, a radio transmitter embodying the present invention is shown and includes a frequency data input terminal 101 and a clock input terminal 102. A DDS 1 generates a frequency hopping signal S3 lying in the VHF band in response to frequency data S1 and a reference clock S2 applied to the terminals 101 and 102, respectively. A phase locked oscillator 2 oscillates a reference signal S4 phase locked to the frequency hopping signal S3. A phase locked oscillator 3 has a modulating terminal 104 to which a modulating signal S6 is applied. In response to the reference signal S4 and modulating signal S6, the phase locked oscillator 3 produces a transmit signal S5 phase locked to the reference signal S4 and modulated in phase in association with the modulating signal S6.

An accumulator 11 is incorporated in the DDS 1 and receives the digital frequency data S1. The accumulator 11 adds the frequency data S1 in response to every reference clock S2 and outputs the sum as an address signal meant for a ROM (Read Only Memory) 12. For example, the accumulator 11 increases the address signal by 1 (one) at a time if the frequency data S1 is "1" or increases it by 2 if the frequency data S1 is "2". The ROM 12 stores sinusoidal signals of frequencies corresponding to such address signals in the form of numerical data. Hence, on receiving the address signal from the accumulator 11, the ROM 12 outputs one sinusoidal signal data matching the address signal. Specifically, assuming that the frequency data S1 is "1", the accumulator 11 sequentially reads out the contents of the ROM 12 while the ROM 12 outputs, assuming that the minimum output frequency is Fmin, n×Fmin sinusoidal signal data. Likewise, assuming that the frequency data S1 is "2," the accumulator 11 reads out every other content of the ROM 12 while the ROM 12 outputs 2n×Fmin sinusoidal signal data. It is to be noted that, assuming that the clock frequency of the reference clock S2 is Fk, the maximum output frequency Fmax to be read out of the ROM 12 is Fk/2. A digital-to-analog (D/A) converter 13 converts the sinusoidal signal data from the ROM 12 to an analog sinusoidal signal. A low pass filter (LPF) 14 removes higher harmonics from the analog sinusoidal signal to produce the frequency hopping signal S3.

The DDS 1 is capable of effecting high-speed frequency hopping in a small frequency step and producing the frequency hopping signal S3 with low phase noise. However, the DDS 1 also generates an inherent line spectrum constituting spurious signal components.

One of the functions assigned to the phase locked oscillator 2 is to remove the spurious signal components from the frequency hopping signal S3. The phase locked oscillator 2, like conventional one, has a phase comparator 21 for comparing the phase of the frequency hopping signal S3 and that of a signal fed from a frequency divider 24 to thereby output an error signal. A loop filter 22 limits the error signal to a predetermined frequency band and thereby produces a control signal. In response to the control signal, a voltage controlled oscillator (VCO) 23 produces a reference signal S4 whose frequency is M (integer) times as high as the frequency of the signal S3, e.g., whose frequency lies in the UHF band. The frequency divider 24 divides the reference signal S4 by M to output the signal to be compared by the phase comparator 21. If the phase locked loop made up of the above-described constituents is provided with a sufficiently narrow loop band, the phase locked oscillator 2 can remove the spurious signal components from the frequency hopping signal S3.

Hereinafter will be described the construction and operation of the phase locked oscillator 3 which is the characteristic feature of the present invention.

The phase locked oscillator 3 has a phase comparator 31 which compares the reference signal S4 and a phase modulated signal S33 to produce an error signal S31. A loop filter 32 limits the error signal S31 to a predetermined frequency band to thereby output a control signal S32. In response to the control signal S32, a VCO 33 generates the transmit signal S5 whose frequency is N (integer) times as high as the frequency of the reference signal S4, e.g., whose frequency lies in the microwave band. The VCO 33 has an oscillating element implemented by a bipolar transistor or a field effect transistor and applies the control signal S32 to a varactor diode to change the frequency of the transmit signal S5.

Part of the transmit signal S5 is separated to produce a transmit signal S35. A frequency divider 35 divides the transmit signal S35 by N to output a 1/N signal S34. The frequency divider 35 may be implemented by a prescaler by way of example. A modulator 34 modulates the phase of the 1/N signal S34 by the modulating signal S6 coming in through the modulating terminal 104, thereby outputting the phase modulated signal S33. The phase locked oscillator 3 is identical in construction with the conventional phase locked oscillator 2 except for the addition of the modulator 34. However, the difference is that the phase locked loop consisting of the phase comparator 31, loop filter 32, VCO 33, frequency divider 35 and modulator 34 has a loop band sufficiently broader than the signal band of the modulating signal S6, as will be described specifically later.

Figure 2:
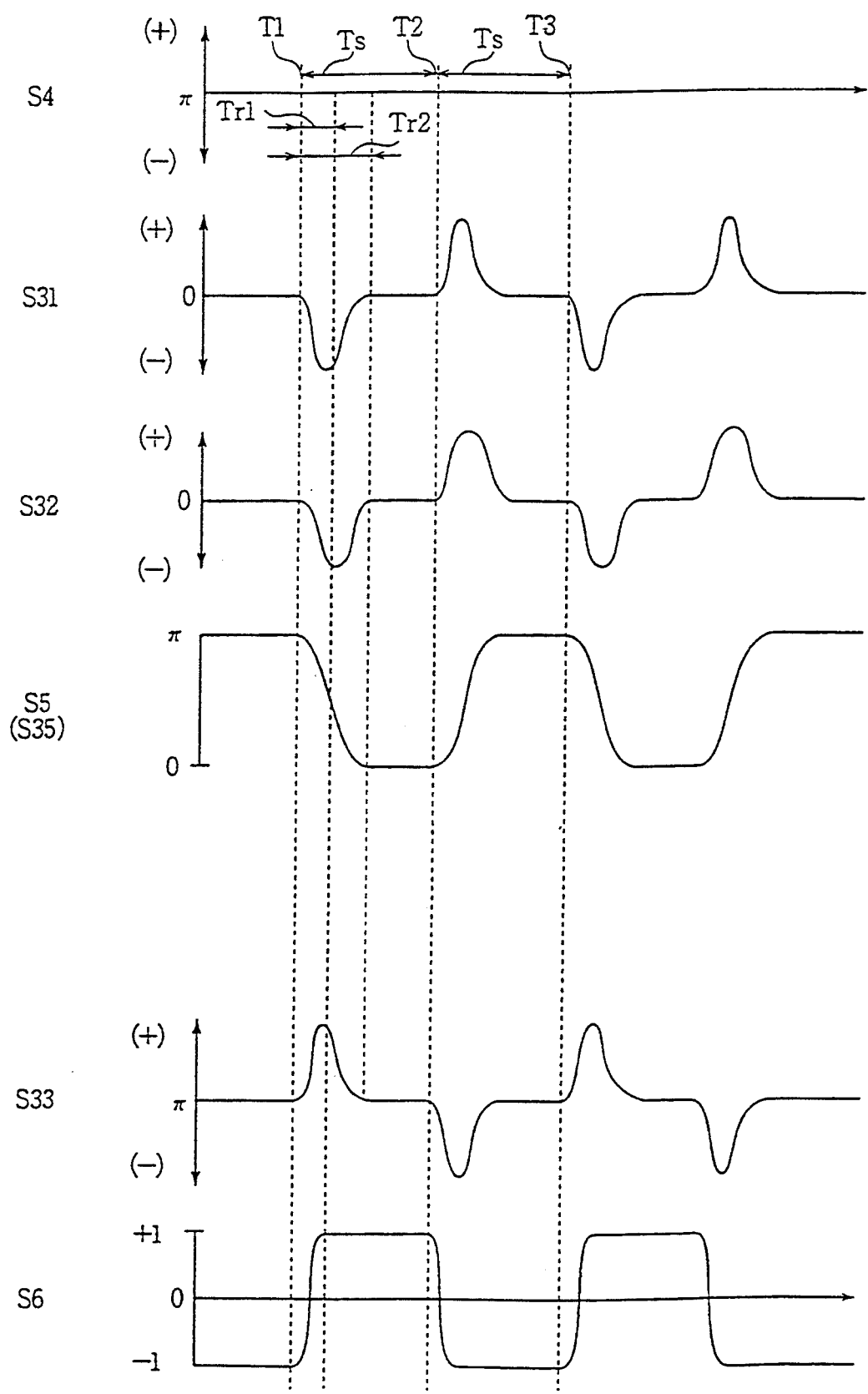
FIG. 2 shows the waveforms of signals appearing in the embodiment.

Referring also to FIG. 2, the modulating signal S6 applied to the modulating terminal 104 is a digital signal having amplitudes "1" and "−1" The initial value and usual value of the modulating signal S6 are "−1". The modulator 34 modulates the 1/N signal S34 in-phase with respect to the two levels and thereby produces the phase modulated signal S33. It is to be noted that the phase of the 1/N signal S34 is assumed to be identical with the phase of the transmit signal S35 (S5) for the sake of illustration. The initial phase (time T1) of the 1/N signal S34 (S5) is $\pi$, and the phase of the phase modulated signal S33 starts advancing substantially in proportion to the amplitude of the modulating signal S6. The amplitude of the error signal S31 follows the phase of the phase modulated signal S33. However, the control signal S32 is slightly delayed from the error signal S31 since the frequency band thereof is limited by the loop filter 32. The transmit signal S5 generated by the VCO 33 has a frequency substantially proportional to the frequency of the control signal S32. Therefore, the phase of the transmit signal S5 is substantially an integrated version of the control signal S32. The transmit signal S5 is divided by the frequency divider 35 to become the 1/N signal S34 and then negatively fed back as a carrier signal for the modulator 34. The modulator 34, therefore, further modulates the phase of the 1/N signal S34. As a result, the phase modulated signal S33 from the modulator 34 is modulated only when the amplitude of the modulating signal S6 changes, while maintaining the phase $\pi$ so long as the modulating signal S6 has the usual amplitude. The phase locked oscillator 3 produces the transmit signal S5 undergone 0-$\pi$ phase modulation substantially matching the amplitudes of the modulating signal S6.

In the phase locked oscillator 3 shown in FIG. 1, the rising time Tr2 of the transmit signal S5 is determined by the loop band of the above-stated phase locked loop (in FIG. 2, the loop band appears as if it were determined by the loop filter 32 for the sake of illustration). Generally, the rising time Tr2 is longer than the rising time Tr1 of the modulation signal S6. The phase modulation degree of the modulator 34 is adequately selected in consideration of the required phase modulation degree of the transmit signal S5 and the phase and amplitude sensitivity of the phase comparator 31, loop filter 32 and VCO 33.

Figure 3:
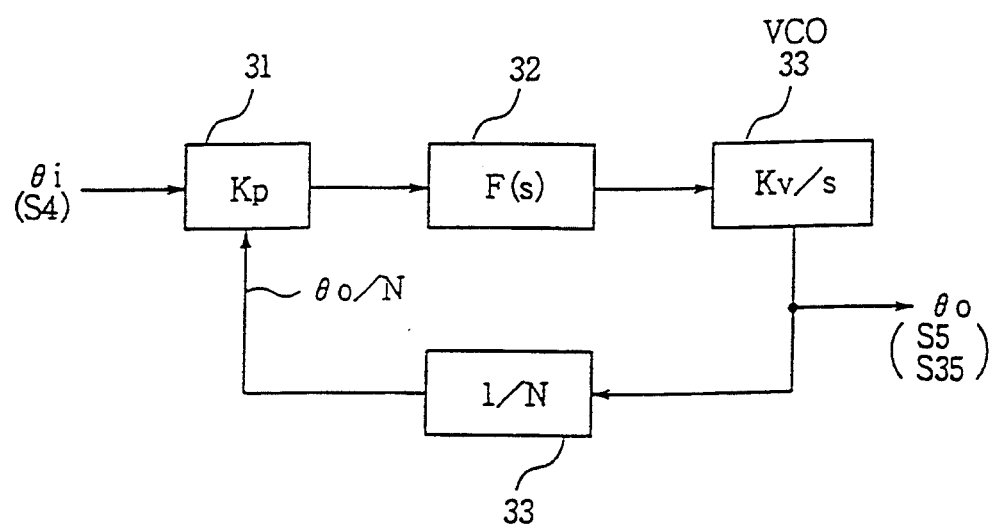
FIG. 3 is a block diagram schematically showing the transfer functions particular to a phase locked loop included in the embodiment.

FIG. 3 shows the transfer functions of the phase locked loop included in the phase locked oscillator 3 in terms of Laplace conversion formula. Specifically, the transfer functions are produced by the following equation including the phase $\theta_i$ of the reference signal S4 and the phase $\theta_o$ of the transmit signal S35:

$$(\theta_i - \theta_o/N) K p \cdot F(s) \cdot K v \cdot /s = \theta_o \quad (1)$$

In FIG. 3, Kp, F(s), Kv/s and 1/N are the transfer functions of the phase comparator 31, loop filter 32, VCO 33, and frequency divider 35, respectively. The transfer function of the modulator 34 is not shown in the figure since the modulator 34 does not contribute to the negative feedback of the phase locked loop.

The round transfer function G(s) of the phase locked loop is expressed as:

$$G(s) = K p \cdot F(s) \cdot K v \cdot /(s \cdot N) \quad (2)$$

The transfer function of the phase $\theta_o$ of the transmit signal S35 associated with the phase $\theta_i$ of the reference signal S4, i.e., the transfer function of the transmit signal S35 associated with the reference signal S4 is produced by:

$$\theta_o/\theta_i = N \cdot G(s)/\{1 + G(s)\} \quad (3)$$

Further, when a phase locked loop exists, the transfer function of the output phase of the VCO 33 is expressed as:

$$\theta_o/N \cdot G(s) = \theta_i/\{1 + G(s)\} \quad (4)$$

Consequently, the output phase $\theta_o/N \cdot G(s)$ of the VCO 33 associated with the phase $\theta_i$ of the reference signal S4 is given by:

$$\theta_o/\{N \cdot G(s) \cdot \theta_i\} = 1/\{1 + G(s)\} \quad (5)$$

Figure 4:
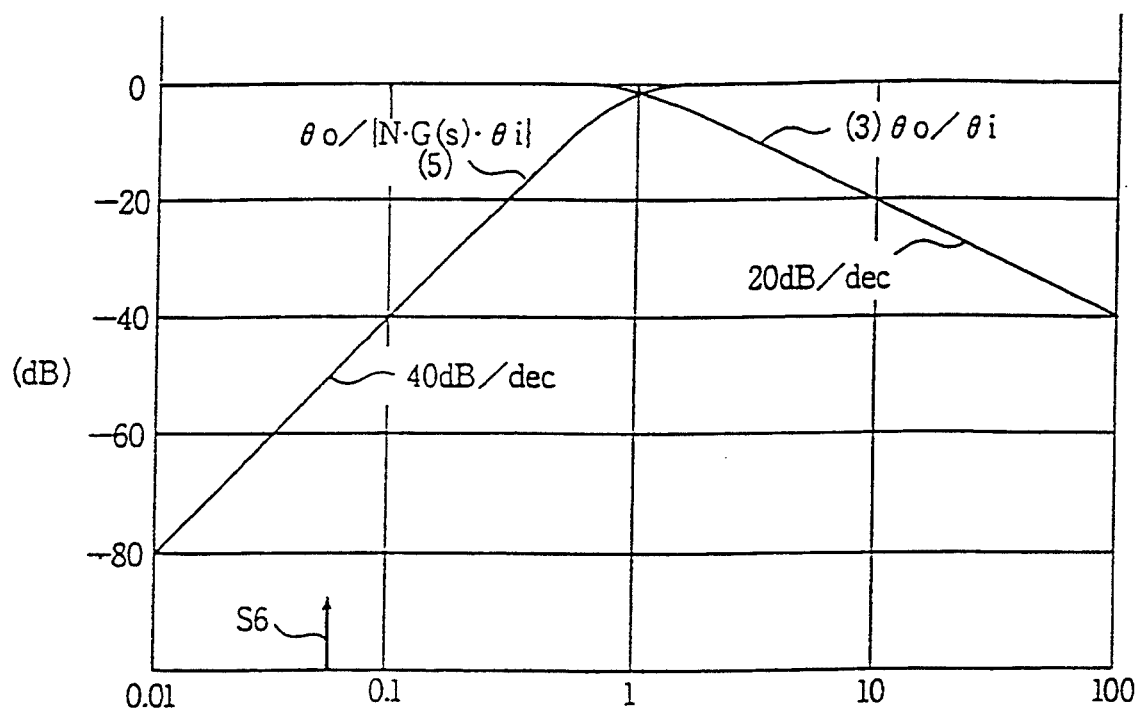
FIG. 4 is a Bode diagram representative of the transfer function of the phase locked loop shown in FIG. 3.

FIG. 4 shows the equations (3) and (4) in a Bode diagram. In the figure, the transfer function F(s) of the loop filter 32 and the denominator N are assumed to be a complete quadratic function and 1, respectively. As FIG. 4 indicates, the transfer function $\theta_o/\theta_i$ of the transmit signal S35 to the reference signal S4 represented by the equation (3) plays the role of a low pass filter, while the transfer function $\theta_o/\{N \cdot G(s) \cdot \theta_i\}$ plays the role of a high pass filter. The loop band of each of such filters is shown as being normalized by the cut-off frequency of the associated filter. The phase locked oscillator 3 sufficiently follows the modulating signal S6 (or phase modulated signal S33) having a lower signal frequency component than the cutoff frequency (normalizing frequency 1) of the phase locked loop band. Further, the phase locked oscillator 3 compresses the phase noise of the output signal S5 ascribable to the VCO 33 at 40 dB/dec in a frequency range lower than the cut-off frequency. It follows that when the modulating signal S6 component of the transmit signal S5 is carrier offset in the above-stated loop band, the phase noise of the transmit signal S5 is improved by the gain of the high pass filter at the carrier offset frequency.

As described above, the radio transmitter shown in FIG. 1 has the phase modulator 34 in the phase locked loop of the phase locked oscillator 3 having a broad loop band. Hence, the radio transmitter does not need a frequency mixer or a band pass filter which would scale up the transmitter. In addition, due to the effect of the broad loop band of the phase locked oscillator 3, the transmitter achieves a transmit signal S5 whose phase noise ascribable to the VCO 33 is reduced.

While the embodiment produces the reference signal S4 by use of a source oscillator implemented as the DDS 1, the DDS 1 may, of course, be replaced with another analog or digital oscillator.

Figure 5A:
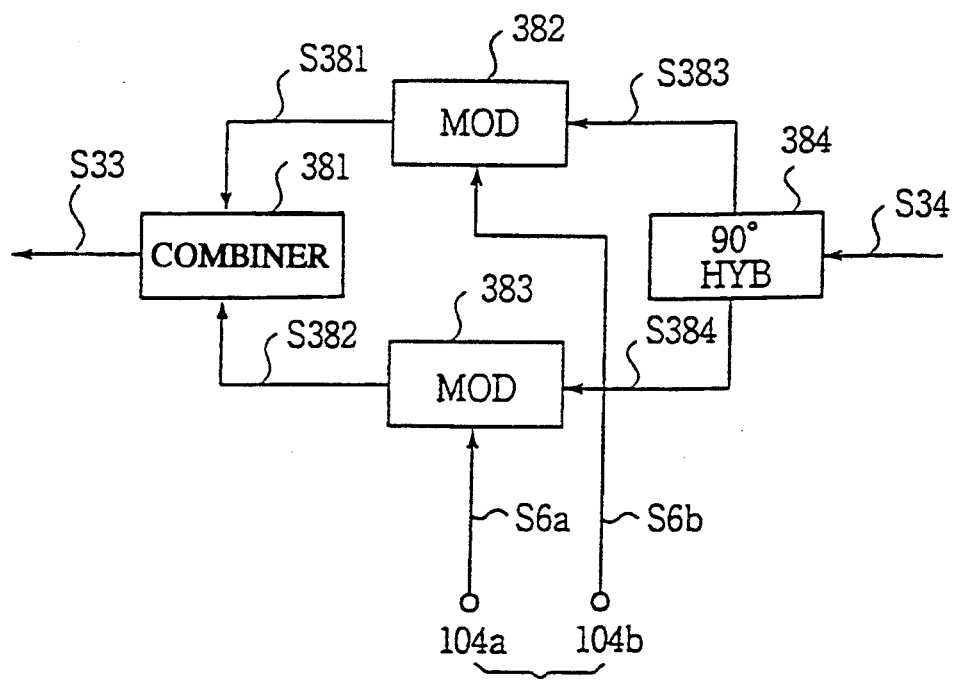
FIG. 5 demonstrates the operation of a modulator included in the embodiment.
Figure 5B:
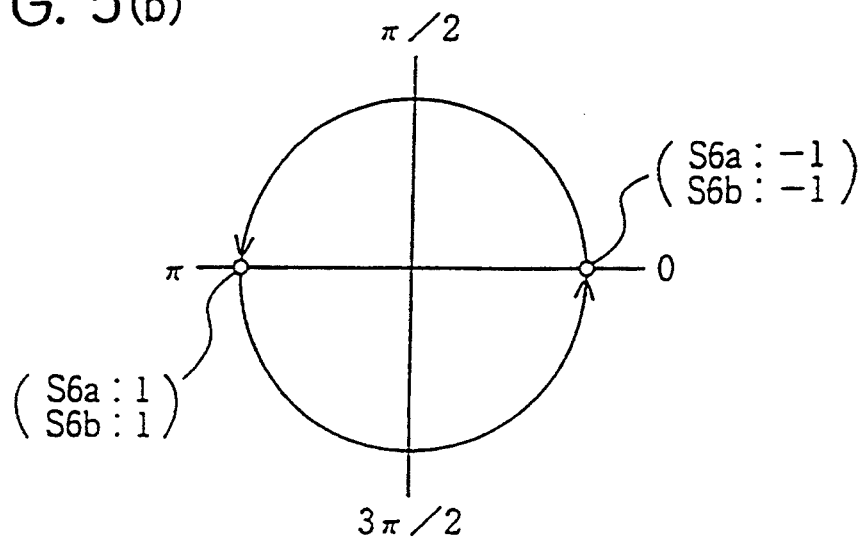

Referring to FIG. 5, the modulator 34 (see FIG. 5(a)) has a hybrid circuit 384 for splitting the 1/N signal S34 into a carrier signal S383 and a carrier signal S384 delayed in phase by 90 degrees from the carrier signal S383. A modulator (MOD) 382 multiplies the carrier signal S383 and a digital signal S6b from a modulating terminal 104b, thereby producing a product signal S381. Likewise, a modulator (MOD) 383 multiplies the carrier signal S384 and a digital signal S6a from a modulating terminal 104a to produce a product signal S382. It is to be noted that the modulating terminals 104a and 104b and the modulating signals S6a and S6b correspond respectively to the modulating terminal 104 and the modulating signal S6, respectively. Implemented as a 0–$\pi$ modulator using, for example, a ring modulator, the modulators 382 and 383 assume the $\pi$ phase when both of the signals S6a and S6b are "1" or assume the 0 phase when both of them are "$-1$". A signal combiner 381 combines the product signals S381 and S382 in-phase. As a result, the modulator 34 outputs a phase modulated signal S33 by modulating the phase of the 1/N signal S34 by the modulating signals S6a and S6b.

The modulator 34 may be implemented as a 4-phase modulator, if desired. Specifically, an arrangement may be made such that the modulating signals S6a and S6b have four different combinations of "1" and "$-1$" so as to provide the phase modulated signal S33 with four different phase transitions, i.e., 0, $\pi/2$, $\pi$ and $3\pi/2$. Then, the phase locked oscillator 3 shown in FIG. 1 will generate the transmit signal S5 having been modulated in four different phases.

Figure 6:
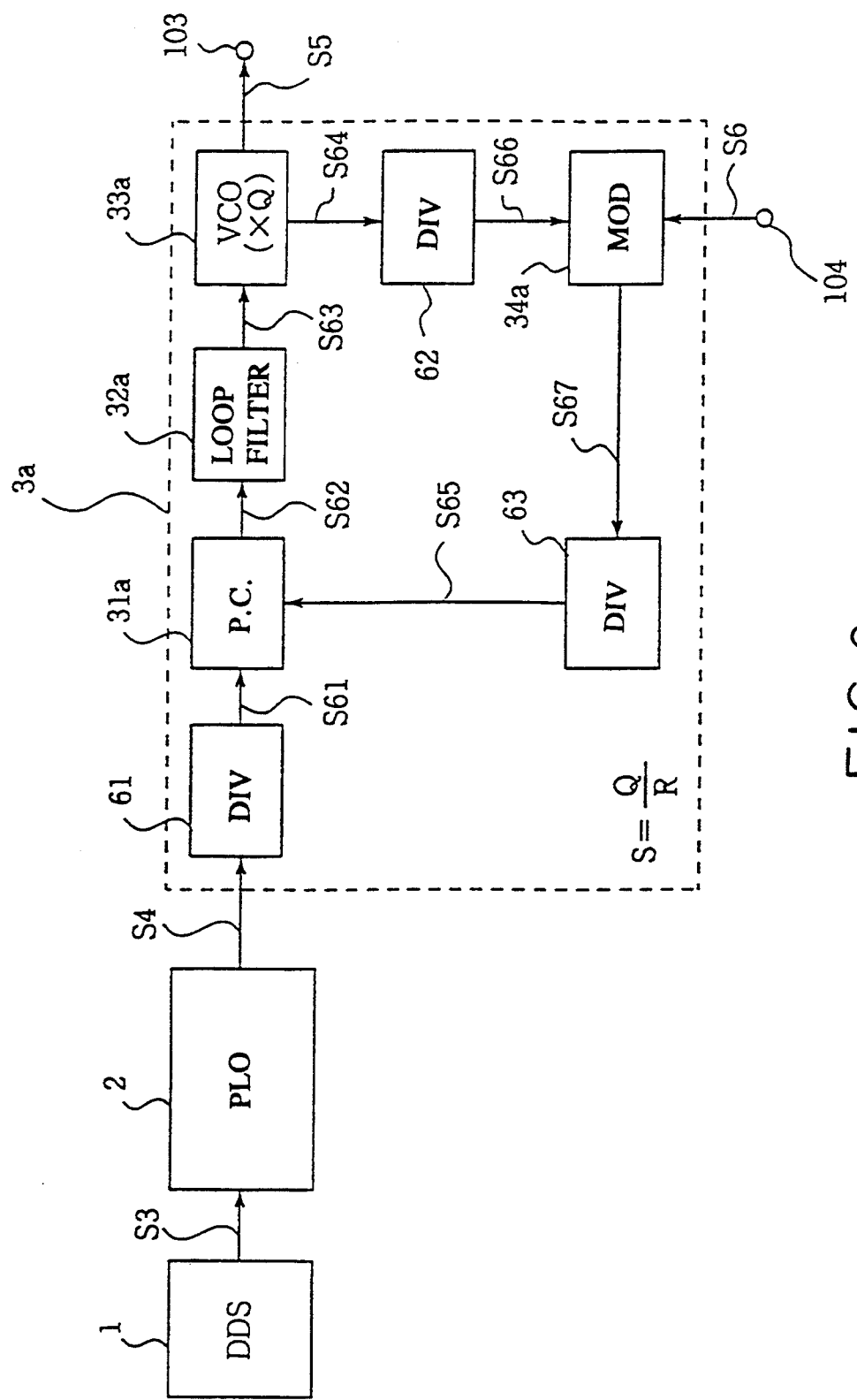
FIGS. 6 and 7 are block diagrams each showing an alternative embodiment of the present invention.

Referring to FIG. 6, an alternative embodiment of the present invention will be described. As shown, the radio transmitter, like the transmitter of FIG. 1, has the DDS1 for generating the frequency hopping signal S3, and the phase locked oscillator 2 for producing the reference signal S4 from the signal S3. The reference signal S4 is applied to a phase locked oscillator 2. The phase locked oscillator 3a, like the oscillator 3 of FIG. 1, is responsive to the reference signal S4 and the modulating signal S6 from the modulating terminal 104 for producing the transmit signal S5 on the transmit terminal 103. The transmit signal S5 has been phase locked to the reference signal S4 and modulated phase by the modulating signal S6.

In this particular embodiment, the phase locked oscillator 3a has a frequency divider 61 which divides the reference signal S4 by P (integer) to produce a 1/P signal S61. The 1/P signal S61 is used as a new reference signal. As a result, a VCO 33a outputs a transmit signal S5 by multiplying the frequency of the 1/P signal S61 by N×P(=Q). A transmit signal S64 from the VCO 33a is divided by R (integer) by a frequency divider 62 to be thereby converted to a 1/R signal S66 whose frequency is adequate as a carrier signal for a modulator 34a. The modulator 34a modulates the phase of the 1/R signal S66 by the modulating signal S6 to output a phase modulated signal S67. The phase modulated signal. S67 is further divided by S (S=Q/R) by a frequency divider 63 to become a 1/S signal S65. A phase comparator 31a compares the phase of the 1/S signal S65 and that of the 1/P signal S61 and produces an error signal S61 representative of a difference. A loop filter 32a limits the band of the error signal S62 to produce a control signal S32 for controlling the VCO 33a. The phase locked oscillator 3a is essentially identical with the oscillator 3 of FIG. 1 in respect of the phase locking operation.

In the embodiment shown in FIG. 6, the phase locked oscillator 2 for generating the reference signal S4 lying in the UHF band is implemented such as inexpensive one as incorporated in an automobile telephone. In addition, the phase locked oscillator 3a divides the reference signal by P by the frequency divider 61 and then compares the reference signal (1/P signal S61) and the signal (1/S signal S65) in the VHF band in which an inexpensive and high performance phase comparator 31a is achievable. Hence, the radio transmitter is desirable in the aspect of performance and cost.

Figure 7:
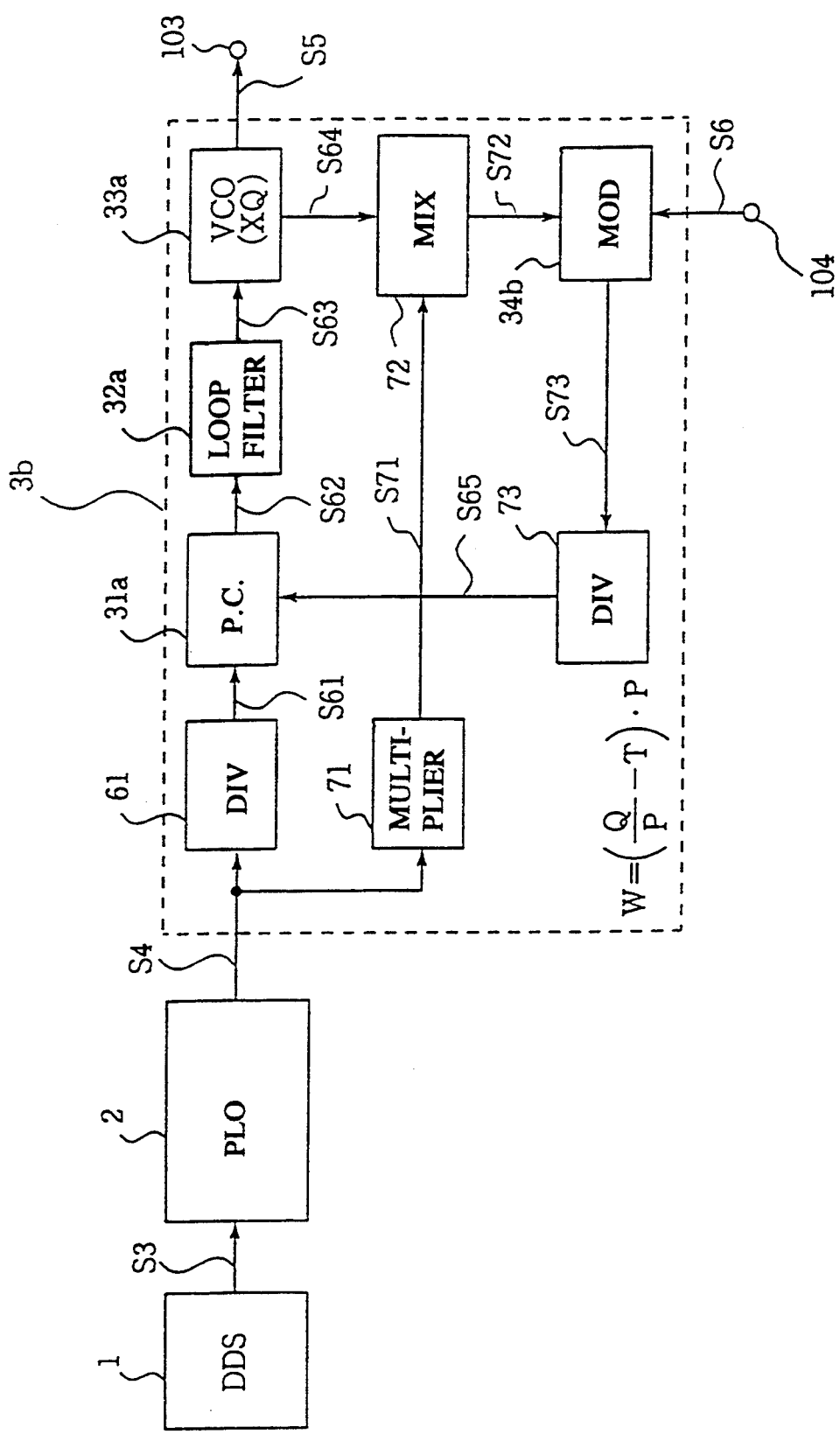

FIG. 7 shows another alternative embodiment of the present invention which also includes the DDS 1 and phase locked oscillator 2. A phase locked oscillator 3b is also responsive to the reference signal S4 from the phase locked oscillator 2 and the modulating signal S6 from the modulating terminal 104 for producing on the transmitting terminal 103 the transmit signal S5 which has been phase locked to the reference signal S4 and modulated in phase by the modulating signal S6.

The phase locked oscillator 3b uses the frequency divider 61, phase comparator 31a, loop filter 32a and VCO 33a for the same purpose as the above-described one. In this embodiment, the phase locked oscillator 3b produces a (carrier) signal S72 for a modulator 34b by combining the frequency of the transmit signal S5 (S64) and a frequency-multiplied version S71 of the reference signal S4. Specifically, a diode multiplier or similar multiplier 71 multiplies the reference signal S4 by T (integer) to produce a frequency-multiplied signal S71. A diode mixer or similar mixer 72 combines the frequencies of the frequency-multiplied signal S71 and transmit signal S64. As a result, the mixer 72 outputs a frequency difference signal S72 which is (Q/P−T) times as high as the reference signal S4. The signal S72 is applied to the modulator 34b as a carrier signal.

The modulator 34b modulates the phase of the frequency difference signal S72 by the modulating signal S6 from the modulating terminal 104 and delivers the resulting phase modulated signal S73 to a frequency divider 73. The frequency divider 73 divides the signal S73 by W (W=(Q/P−T)) to produce a 1/W signal S65a. The 1/W signal S65a has the same frequency as the previously mentioned 1/P signal S61. The phase comparator 31 a compares the phases of the 1/W signal S71 and 1/P signal S61. The phase locked oscillator 3b operates in essentially the same manner as the phase locked oscillator 3a of FIG. 6.

The frequency divider 61 included in the phase locked oscillator 3b may be omitted, if desired. Then, the frequency division ratio P of the frequency divider 61 and that W of the frequency divider 73 will be 1 and (Q-T), respectively. The frequency divider 73 is also omissible since, when the denominator W of the frequency divider 73 is 1, the multiplier T of the multiplier 71 is (Q-1)/P².

The frequencies of signals appearing in the circuitry of FIG. 7 are listed in Table below.

TABLE 1

| S3 | 109.375~113.28125 | 1.5625 |

TABLE 1-continued

| S61 | (P = M = W = 8) | |
| S65a | | |
| S4 | 875.0~906.25 (M = 8) | 12.5 |
| S72 | (Q/P − T = W = 8) | |
| S73 | | |
| S5 | 14,000~14,500 | 200.0 |
| S64 | (Q = 128) | |
| S71 | 13,125~13,593.75 (T = 15) | 187.5 |

The DDS 1 is capable of causing the frequency hopping; signal S3 lying in the frequency range of from 109.375 MHz to 113.28125 MHz to hop a step of 1.5625 Hz.

The reference signal S4 produced by the phase locked oscillator 2 has a frequency of 875.0 MHz to 906.25 MHz which is eight (M=8) times as high as the frequency hopping signal S3. The phase locked oscillator 2 has a phase locked loop band whose cut-off frequency is about 1 KHz and, therefore, sufficiently suppresses the spurious signal components included in the frequency hopping signal S3. The level of the reference signal S4 is about 0 dBm. In the phase locked oscillator 3b, the frequency division ratio P of the frequency divider 61 is 8 while the frequency of the 1/P signal S61 is the same as that of the frequency hopping signal S3. The VCO 33a can multiply the 1/P signal by 128 (Q= 128) to thereby output the transmit signal S5 having a frequency range of from 14,000 MHz to 14,500 MHz and a frequency step of 200 Hz. When the oscillating element of the VCO 33a is implemented by a bipolar transistor, the transmit signal S5 achieves a level of about 27 dBm. The multiplier 71 produces the signal S71 by multiplying the reference signal S4 by 15 (T=15). As a result, the mixer 72 delivers to the modulator 34b the frequency difference signal S72 whose frequency is (Q/P−T)=(128/8−15)=1 times as high as the frequency of the reference signal S4, i.e., equal to the frequency of the reference signal S4.

The modulating signal S6 is a bilevel signal of 34 kbit/s. The phase locked loop of the phase locked oscillator 3b has a cut-off frequency designed to be about 500 KHz and, therefore. sufficiently follows the modulating signal S6. In a Bode diagram, the center frequency of the modulating signal S6 is positioned at the normalizing frequency of 34 KHz/500 KHz=0.07. At this carrier offset frequency, phase noise of the transmit signal S5 ascribable to the VCO 33a is improved by about 45 dB.

The phase locked oscillator 3b shown in FIG. 7 uses the mixer 72 and multiplier 71 practicable with a small number of parts in place of the frequency divider 62 of FIG. 6. The radio transmitter is, therefore, even lower in cost and smaller in size than the radio transmitter of FIG. 6.

In summary, in the illustrative embodiments, the radio transmitter sends the transmit signal S5 phase locked to the reference signal S4 and modulated in phase by the modulating signal S6 via the VCO 33 (or 33a) built in the phase locked oscillator 3 (or 3a or 3b). The phase locked oscillator 3 includes the modulator 34 (or 34a or 34b) which modulates the phase of the transmit signal S5 or that of the frequency divided version of the transmit signal S5 by the modulating signal S6. The modulated signal S33 (or S67 or S73) from the modulator 34 is used as a signal to be compared or a source of signal to be compared. Since the phase locked oscillator 3 has a phase locked loop band sufficiently broader than the signal band of the modulating signal S6, not only the phase modulated signal (transmit signal) S5 sufficiently follows the modulating signal S6, but also the phase noise of the transmit signal S5 ascribable to the VCO 33 is reduced.

The radio transmitter of the present invention may further include the DDS 1 for supplying the frequency hopping signal S3, and the phase locked oscillator 2 for generating the reference signal S4 phase locked to the frequency hopping signal. By sufficiently reducing the phase locked loop band of the phase locked oscillator 2, it is possible to eliminate spurious signals apt to occur in the frequency hopping signal S3 while insuring the rapid frequency hopping ability of the DDS1.

Although the invention has been described with reference to the specific embodiments, this description is not meant to be construed in a limiting sense. Various modifications of the disclosed embodiments, as well as other embodiments of the invention, will become apparent to persons skilled in the art upon reference to the description of the invention. It is, therefore, contemplated that the appended claims will cover any modifications or embodiments as fall within the true scope of the invention.

What is claimed is:

1. A radio transmitter comprising:
   reference signal inputting means for receiving a reference signal;
   modulating signal inputting means for receiving a modulating signal;
   transmit signal outputting means for outputting a transmit signal;
   voltage controlled oscillating means responsive to a control signal for generating the transmit signal phase locked to the reference signal; and
   phase locking means responsive to the reference signal, the modulating signal and the transmit signal for generating the control signal;
   said phase locking means comprising phase modulating means for generating a phase modulated signal by modulating a phase of a signal associated with the transmit signal by the modulating signal.

2. A radio transmitter as claimed in claim 1, wherein the modulating signal has a signal band narrower than a first phase locked loop band of a first phase locked loop constituted by said voltage controlled oscillating means and said phase locking means.

3. A radio transmitter as claimed in claim 1, wherein said voltage controlled oscillating means generates the transmit signal with a frequency substantially N (integer) times as high as a frequency of the reference signal;
   said phase locking means further comprising:
   frequency dividing means for dividing the frequency of the transmit signal by N (an integer) to feed a resulting 1/N frequency divided signal to said phase modulating means;
   phase comparing means for comparing a phase of the reference signal and a phase of the phase modulated signal; and
   loop filter means for generating the control signal by limiting an output of said phase comparing means to a predetermined signal band.

4. A radio transmitter as claimed in claim 1, wherein said voltage controlled oscillating means generates the transmit signal with a frequency substantially N (an integer) times as high as a frequency of the reference signal;
   said phase modulating means modulating a phase of the transmit signal by the modulating signal;
   said phase locking means further comprising:
   frequency dividing means for dividing the phase modulated signal by N (an integer) to produce a 1/N frequency divided modulated signal;
   phase comparing means for comparing a phase of the reference signal and a phase of the 1/N frequency divided modulated signal; and
   loop filter means for generating the control signal by limiting an output of said phase comparing means to a predetermined signal band.

5. A radio transmitter as claimed in claim 1, wherein said voltage controlled oscillating means generates the transmit signal with a frequency substantially Q (an integer) times as high as a frequency of the reference signal;
   said phase locking means further comprising:
   first frequency dividing means for dividing the transmit signal by R (an integer) smaller than Q and feeding a resulting I/R frequency divided signal to said phase modulating means;
   second frequency dividing means for dividing the phase modulated signal by S (an integer) to produce a frequency divided modulated signal;
   phase comparing means for comparing a phase of the reference signal and a phase of the frequency divided modulated signal; and
   loop filter means for generating the control signal by limiting an output of said phase comparing means to a predetermined signal band, wherein Q equals S times R.

6. A radio transmitter as claimed in claim 3, wherein said phase modulating means comprises:
   signal splitting means for splitting the 1/N frequency divided signal into a first carrier signal and a second carrier signal delayed in phase by 90° from said first carrier signal;
   first multiplying means for multiplying the first carrier signal and a first digital signal to produce a first product signal;
   second multiplying means for multiplying the second carrier signal and a second digital signal to produce a second product signal; and
   signal combining means for combining the first and second product signals in-phase to produce the phase modulated signal.

7. A radio transmitter as claimed in claim 1, further comprising frequency dividing means for dividing the reference signal and feeding a resulting frequency divided signal as a new reference signal.

8. A radio transmitter as claimed in claim 5, further comprising frequency dividing means for dividing the reference signal and feeding a resulting frequency devided signal as a new reference signal.

9. A radio transmitter comprising:
   reference signal inputting means for receiving a reference signal;
   modulating signal inputting means for receiving a modulating signal;
   transmit signal outputting means for outputting a transmit signal;
   first frequency dividing means for dividing the reference signal to produce a frequency divided reference signal;
   multiplying means for multiplying the reference signal to produce a frequency multiplied reference signal;

voltage controlled oscillating means responsive to a control signal for generating the transmit signal phase locked to the frequency divided reference signal;

frequency combining means for combining a frequency of the transmit signal and a frequency of the frequency multiplied reference signal to produce a difference frequency signal;

phase modulating means for modulating a phase of the difference frequency signal by the modulating signal to produce a phase modulated signal;

second frequency dividing means for dividing the phase modulated signal to produce a frequency divided modulated signal;

phase comparing means for comparing a phase of the frequency divided reference signal and a phase of the frequency divided modulated signal; and loop filter means for producing the control signal by limiting an output of said phase comparing means to a predetermined signal band.

10. A radio transmitter as claimed in claim 9, wherein the difference frequency signal anti the reference signal have the same frequency.

11. A radio transmitter as claimed in claim 9, wherein the modulating signal has a signal band narrower than a first phase locked loop band of a first phase locked loop constituted by said voltage controlled oscillating means, said frequency combining means, said phase modulating means, said second frequency dividing means, said phase comparing means, and said loop filter means.

12. A radio transmitter as claimed in claim 11, wherein said phase modulating means comprises: signal splitting means for splitting the difference frequency signal into a first carrier signal and a second carrier signal delayed in phase by 90 degrees from said first carrier signal;

first multiplying means for multiplying the first carrier signal and a first digital signal to produce a first product signal;

second multiplying means for multiplying the second carrier signal and a second digital signal to produce a second product signal; and signal combining means for combining the first and second product signals in-phase to produce the phase modulated signal.

13. The radio transmitter of claim 2, further comprising:

a direct digital frequency synthesizer for causing a frequency of an output signal to hop in response to frequency data;

phase locked oscillating means having a second phase locked loop band narrower than the first phase locked loop band and supplied with the output signal to produce the reference signal.

14. The radio transmitter of claim 11, further comprising:

a direct digital frequency synthesizer for causing a frequency of an output signal to hop in response to frequency data;

phase locked oscillating means having a second phase locked loop band narrower than the first phase locked loop and supplied with the output signal to produce the reference signal.

* * * * *